US010375854B2

(12) United States Patent
Liu et al.

(10) Patent No.: US 10,375,854 B2
(45) Date of Patent: Aug. 6, 2019

(54) LIQUID COOLING SYSTEM AND CONTROL METHOD THEREOF

(71) Applicant: Huawei Technologies Co., Ltd., Shenzhen (CN)

(72) Inventors: Yunju Liu, Yokohama (JP); Quanming Lv, Shenzhen (CN); Tanfu Xiao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 472 days.

(21) Appl. No.: 14/981,068

(22) Filed: Dec. 28, 2015

(65) Prior Publication Data

US 2016/0113154 A1 Apr. 21, 2016

Related U.S. Application Data

(63) Continuation of application No. PCT/CN2014/077117, filed on May 9, 2014.

(30) Foreign Application Priority Data

Oct. 23, 2013 (CN) .......................... 2013 1 0503792

(51) Int. Cl.
H05K 7/20 (2006.01)
(52) U.S. Cl.
CPC ......... *H05K 7/20281* (2013.01); *H05K 7/207* (2013.01); *H05K 7/20254* (2013.01); *H05K 7/20263* (2013.01); *H05K 7/20272* (2013.01)
(58) Field of Classification Search
CPC ........... H05K 7/20281; H05K 7/20272; H05K 7/20263; H05K 7/207

(Continued)

(56) References Cited

U.S. PATENT DOCUMENTS 5,348,076 A 9/1994 Asakawa
6,182,742 B1 2/2001 Takahashi et al.
(Continued)

FOREIGN PATENT DOCUMENTS

CN 1625328 A 6/2005
CN 1625329 A 6/2005
(Continued)

OTHER PUBLICATIONS

Foreign Communication From a Counterpart Application, PCT Application No. PCT/CN2014/077117, English Translation of International Search Report dated Jun. 30, 2014, 2 pages.

(Continued)

*Primary Examiner* — Joel M Attey
(74) *Attorney, Agent, or Firm* — Conley Rose, P.C.

(57) ABSTRACT

A liquid cooling system and a control method thereof are disclosed. The liquid cooling system includes at least two second-level liquid circulation loops and a cooling control apparatus. One second-level liquid circulation loop is provided with a circulating pump configured to control a liquid flow and a sensing apparatus configured to acquire liquid sample data. The control method includes acquiring liquid sample data using sensing apparatuses of a liquid cooling system; implementing sharing of the liquid sample data of the sensing apparatuses using a cooling control apparatus, performing analytical processing on the liquid sample data, and calculating a circulation regulation value of circulating pumps; and sending the circulation regulation value to the circulating pumps using the cooling control apparatus, such that the circulating pumps run according to the circulation regulation value.

7 Claims, 8 Drawing Sheets

(58) Field of Classification Search
USPC .................................. 165/244, 246, 247
See application file for complete search history.

(56) References Cited

U.S. PATENT DOCUMENTS

| | | | |
|---|---|---|---|
| 2005/0122684 A1 | 6/2005 | Chu et al. | |
| 2005/0122685 A1 | 6/2005 | Chu et al. | |
| 2006/0289148 A1 | 12/2006 | Wei | |
| 2007/0227710 A1* | 10/2007 | Belady | H05K 7/2079 165/122 |
| 2010/0236772 A1 | 9/2010 | Novotny et al. | |
| 2010/0305775 A1 | 12/2010 | Bean et al. | |
| 2011/0056674 A1 | 3/2011 | Campbell et al. | |
| 2013/0248140 A1 | 9/2013 | Haigh | |
| 2014/0068943 A1* | 3/2014 | Campbell | B21D 53/02 29/890.035 |
| 2014/0202678 A1* | 7/2014 | Goth | H05K 7/20772 165/287 |
| 2015/0075764 A1* | 3/2015 | Goth | H05K 7/20772 165/279 |

FOREIGN PATENT DOCUMENTS

| | | |
|---|---|---|
| CN | 201491450 U | 5/2010 |
| CN | 102422230 A | 4/2012 |
| CN | 202946230 U | 5/2013 |
| CN | 103334822 A | 10/2013 |
| JP | 2000130912 A | 5/2000 |
| JP | 2003029879 A | 1/2003 |

OTHER PUBLICATIONS

Foreign Communication From a Counterpart Application, PCT Application No. PCT/CN2014/077117, Written Opinion dated Jun. 30, 2014, 4 pages.
Foreign Communication From a Counterpart Application, European Application No. 14855250.8, European Office ction dated Mar. 8, 2018, 6 pages.
Foreign Communication From a Counterpart Application, Chinese Application No. 201310503792.X, Chinese Search Report dated Aug. 4, 2016, 2 pages.
Foreign Communication From a Counterpart Application, Chinese Application No. 201310503792.X, Chinese Office Action dated Aug. 12, 2016, 7 pages.
Partial English Translation and Abstract of Japanese Patent Application No. JP2000130912, Part 1, dated Jun. 21, 2016, 6 pages.
Partial English Translation and Abstract of Japanese Patent Application No. 2000130912, Part 2, dated Jun. 21, 2016, 2 pages.
Foreign Communication From a Counterpart Application No. European Application No. 14855250.8, Extended European Search Report dated Jun. 9, 2016, 8 pages.

* cited by examiner

LIQUID COOLING SYSTEM AND CONTROL METHOD THEREOF

CROSS-REFERENCE TO RELATED APPLICATIONS

This application is a continuation of International Application No. PCT/CN2014/077117, filed on May 9, 2014, which claims priority to Chinese Patent Application No. 201310503792.X, filed on Oct. 23, 2013, both of which are hereby incorporated by reference in their entireties.

TECHNICAL FIELD

The present disclosure relates to the field of liquid cooling, and in particular, to a liquid cooling system and a control method thereof.

BACKGROUND

As the size of an electronic component decreases and the performance and speed increase, energy consumption and thermal design power of a chip become increasingly higher. Heat dissipation performance and surface temperature uniformity of the electronic component directly affect performance and long-term reliability of the component. A fan radiator is a conventional heat dissipation manner. With the combination of information and communications technologies (ICTs) and the continuous increase of power consumption, the fan radiator is also improved in aspects such as a rotation speed and a size. However, air cooling cannot increase a heat dissipation capacity without limit, and causes a prominent problem of noise. The development of liquid cooling technologies can make up for such a deficiency. Currently, liquid cooling has been already applied in multiple fields such as data centers, servers, and personal computers (PCs).

For a heat dissipation device having high power consumption, multiple liquid cooling units (LCUs) are needed for heat dissipation. In the prior art, multiple liquid cooling units are generally connected in parallel, and each of the liquid cooling units is controlled by using an independent control unit. A cooling control unit collects liquid data of the liquid cooling units, such as liquid pressure, flows, and temperatures, and controls circulating pumps in real time according to the collected liquid data. The technical solution has the following defects. First, the technical solution does not support flow equalization adjustment. Liquid flows in pipes of multiple LCUs may be unequal, and when a circulating pump in one LCU rotates at a high speed, and a circulating pump in another LCU rotates at a low speed or even does not rotate, there may be a risk that the circulating pumps break down, which causes a problem of reliability. Second, because the liquid cooling units are connected in parallel, an action of any control unit has an effect on a liquid flow of an entire heat dissipation system. Because the control units separately control corresponding liquid cooling units, an action of one control unit inevitably leads to an action of another control unit, which may cause a problem of oscillations of adjustments of circulating pumps and valves. Frequent oscillations are harmful for overall balance of the entire heat dissipation system, and shorten a service life of the circulating pumps and the valves, and a liquid fluctuation caused by an oscillation causes problems of performance degradation and service life reduction of a to-be-cooled device. Third, the technical solution is unfavorable for refined energy conservation management of the LCUs. Energy consumption of a circulating pump is proportional to a rotation speed thereof raised to the third power. When multiple circulating pumps run simultaneously, different rotation speeds of the circulating pumps and frequent adjustments increase energy consumption. Fourth, if adjusting valves of the multiple LCUs perform adjustments separately, the entire system cannot remain stable, and cyclical regulation of the valves oscillates, thereby greatly reducing service lives of the adjusting valves.

SUMMARY

A technical problem to be solved by the present disclosure is to provide a liquid cooling system and a control method thereof, so as to effectively ensure operating stability of a liquid cooling system, improve a useful life, and dissipate heat of a to-be-cooled device effectively and stably.

According to a first aspect of the present disclosure, an embodiment of the present disclosure provides a liquid cooling system, including a cooling control apparatus and at least two second-level liquid circulation loops configured to dissipate heat of a to-be-cooled device, where the at least two second-level liquid circulation loops are connected in parallel, and each of the second-level liquid circulation loops is provided with a circulating pump configured to control a liquid flow and a sensing apparatus configured to acquire liquid sample data; and the cooling control apparatus is electrically connected to each of the sensing apparatuses and each of the circulating pumps, and the cooling control apparatus is configured to implement sharing of the liquid sample data of the sensing apparatuses of the at least two second-level liquid circulation loops, perform analytical processing on the liquid sample data of the sensing apparatuses of the at least two second-level liquid circulation loops, and send a same control signal to the circulating pumps of the at least two second-level liquid circulation loops, so as to control the circulating pumps of the at least two second-level liquid circulation loops to be in a same running state.

In a first possible implementation manner of the first aspect, the cooling control apparatus includes at least two cooling control units, the cooling control units are in a one-to-one correspondence with the second-level liquid circulation loops, and the cooling control units are electrically connected and share data; and the cooling control unit includes a data collection module, a data filtering module, a signal control module, and a communication module, where the data collection module is configured to receive the liquid sample data acquired by the sensing apparatus, the data filtering module is configured to filter the liquid sample data, the signal control module is configured to perform analytical processing on the liquid sample data and send a control signal to the circulating pumps, and the communication module is configured to control data transmission between the cooling control units; and the liquid sample data received by the data collection module is filtered by the data filtering module and then sent to the signal control module, the signal control module performs analytical processing on the liquid sample data, data sharing is implemented between the cooling control units using the communication module, and the signal control module sends the control signal to the circulating pumps to control running states of the circulating pumps.

In a second possible implementation manner of the first aspect, the cooling control apparatus includes at least two data collection units and a monitoring board, where the data collection units are in a one-to-one correspondence with the second-level liquid circulation loops, the data collection units are electrically connected to corresponding sensing apparatuses of the second-level liquid circulation loops and are configured to collect liquid sample data, all the data collection units are electrically connected to the monitoring board, so as to send the liquid sample data to the monitoring board; the monitoring board is configured to perform analytical processing on the liquid sample data; and the monitoring board is electrically connected to all the circulating pumps of the second-level liquid circulation loops, so as to send the control signal to the circulating pumps.

According to a second aspect, an embodiment of the present disclosure further provides a control method of a liquid cooling system, applied to the foregoing liquid cooling system, where the control method includes the following steps: collecting liquid sample data from second-level liquid circulation loops using sensing apparatuses of the liquid cooling system; implementing sharing of the liquid sample data of the sensing apparatuses using a cooling control apparatus of the liquid cooling system, performing analytical processing on the liquid sample data, and calculating, according to the liquid sample data, a circulation regulation value corresponding to circulating pumps of the second-level liquid circulation loops; and sending the circulation regulation value to the circulating pumps on the second-level liquid circulation loops using the cooling control apparatus, such that all the circulating pumps on the second-level liquid circulation loops run according to the circulation regulation value.

In a first possible implementation manner of the second aspect, in a case in which the cooling control apparatus includes at least two cooling control units, the second-level liquid circulation loops are in a one-to-one correspondence and cooperation with the cooling control units, and the cooling control units are electrically connected and share data, where one cooling control unit is a master machine, and the other cooling control unit is a slave machine; in the step of implementing sharing of the liquid sample data of the sensing apparatuses using a cooling control apparatus of the liquid cooling system, performing analytical processing on the liquid sample data, and calculating, according to the liquid sample data, a circulation regulation value corresponding to circulating pumps of the second-level liquid circulation loops, the second-level liquid circulation loops collect the liquid sample data using respective cooling control units, the collected liquid sample data is sent to the master machine using each slave machine, analytical processing is performed on the liquid sample data using the master machine, and the circulation regulation value corresponding to the circulating pumps of the second-level liquid circulation loops is calculated according to the liquid sample data; and in the step of sending the circulation regulation value to the circulating pumps on the second-level liquid circulation loops using the cooling control apparatus, such that all the circulating pumps on the second-level liquid circulation loops run according to the circulation regulation value, the circulation regulation value is sent to each slave machine using the master machine, and circulating pumps corresponding to the master machine and each slave machine are controlled according to the circulation regulation value using the master machine and the slave machine.

In a second possible implementation manner of the second aspect, in a case in which the cooling control apparatus includes at least two data collection units and a monitoring board, the data collection units are in a one-to-one correspondence and cooperation with the second-level liquid circulation loops, and all the data collection units are electrically connected to the monitoring board; in the step of implementing sharing of the liquid sample data of the sensing apparatuses using a cooling control apparatus of the liquid cooling system, performing analytical processing on the liquid sample data, and calculating, according to the liquid sample data, a circulation regulation value corresponding to circulating pumps of the second-level liquid circulation loops, the liquid sample data collected by the sensing apparatuses is sent to the cooling control apparatus using the data collection units to implement sharing of the liquid sample data, and centralized analytical processing is performed on the liquid sample data using the monitoring board, to calculate the circulation regulation value corresponding to the circulating pumps of the second-level liquid circulation loops; and in the step of sending the circulation regulation value to the circulating pumps on the second-level liquid circulation loops using the cooling control apparatus, such that all the circulating pumps on the second-level liquid circulation loops run according to the circulation regulation value, the monitoring board is used to perform the step.

In a third possible implementation manner of the second aspect, the control method further includes a step of performing fault scanning and processing on the second-level liquid circulation loops separately; and the step of performing fault scanning and processing on the second-level liquid circulation loops separately further includes the following steps: determining whether the collected liquid sample data exceeds an allowed error range; if the collected liquid sample data exceeds the allowed error range, determining that a fault occurs in a second-level liquid circulation loop corresponding to the liquid sample data exceeding the allowed error range; and providing at least one backup second-level liquid circulation loop, and switching from the faulty second-level liquid circulation loop to the backup second-level liquid circulation loop.

With reference to the third possible implementation manner of the second aspect, in a fourth possible implementation manner of the second aspect, the step of performing fault scanning and processing on the second-level liquid circulation loops separately further includes checking whether the backup second-level liquid circulation loop is normal; in a case in which there is one backup second-level liquid circulation loop, if the backup second-level liquid circulation loop is abnormal, performing fault alarming; and in a case in which there are two or more backup second-level liquid circulation loops, if one checked backup second-level liquid circulation loop is abnormal, switching to a next backup second-level liquid circulation loop.

In a fifth possible implementation manner of the second aspect, there are three or more second-level liquid circulation loops, and the control method further includes dividing a running time of the liquid cooling system into multiple preset time segments, where a previous preset time segment and a next preset time segment are two successive time segments among the multiple preset time segments; within the previous preset time segment, selecting a preset quantity of second-level liquid circulation loops as standbys and stopping running the second-level liquid circulation loops, and starting running the other second-level liquid circulation loops to dissipate heat of a to-be-cooled device, where the preset quantity is at least one; and within the next preset time segment, starting running the second-level liquid circulation loops used as standbys within the previous preset time segment, to dissipate heat of the to-be-cooled device, and selecting, from the second-level liquid circulation loops running within the previous preset time segment, the preset quantity of second-level liquid circulation loops as standbys and stopping running the second-level liquid circulation loops.

In a sixth possible implementation manner of the second aspect, a heat exchanger is connected in each of the second-level liquid circulation loops, and a cooling apparatus is disposed on each heat exchanger; the liquid sample data further includes a liquid temperature; and the control method further includes calculating a cooling regulation value corresponding to the cooling apparatuses using the cooling control apparatus, and sending the cooling regulation value to the cooling apparatuses using the cooling control apparatus, such that all the cooling apparatuses run according to the cooling regulation value.

According to the liquid cooling system and the control method thereof provided by the embodiments of the present disclosure, a cooling control apparatus is used to implement sharing and centralized analytical processing of liquid sample data, and a same circulation regulation value is sent to circulating pumps, to implement synchronization control over the circulating pumps, such that second-level liquid circulation loops run in a same running state; and when a liquid condition in one second-level liquid circulation loop changes, the circulating pumps on all the second-level liquid circulation loops can be adjusted simultaneously, so as to achieve system balance, thereby avoiding a problem of oscillations of adjustments of the circulating pumps, prolonging service lives of the circulating pumps, improving performance and a service life of an entire heat dissipation device, and ensuring that heat of a to-be-cooled device is dissipated effectively and stably.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure.

Figure 1:
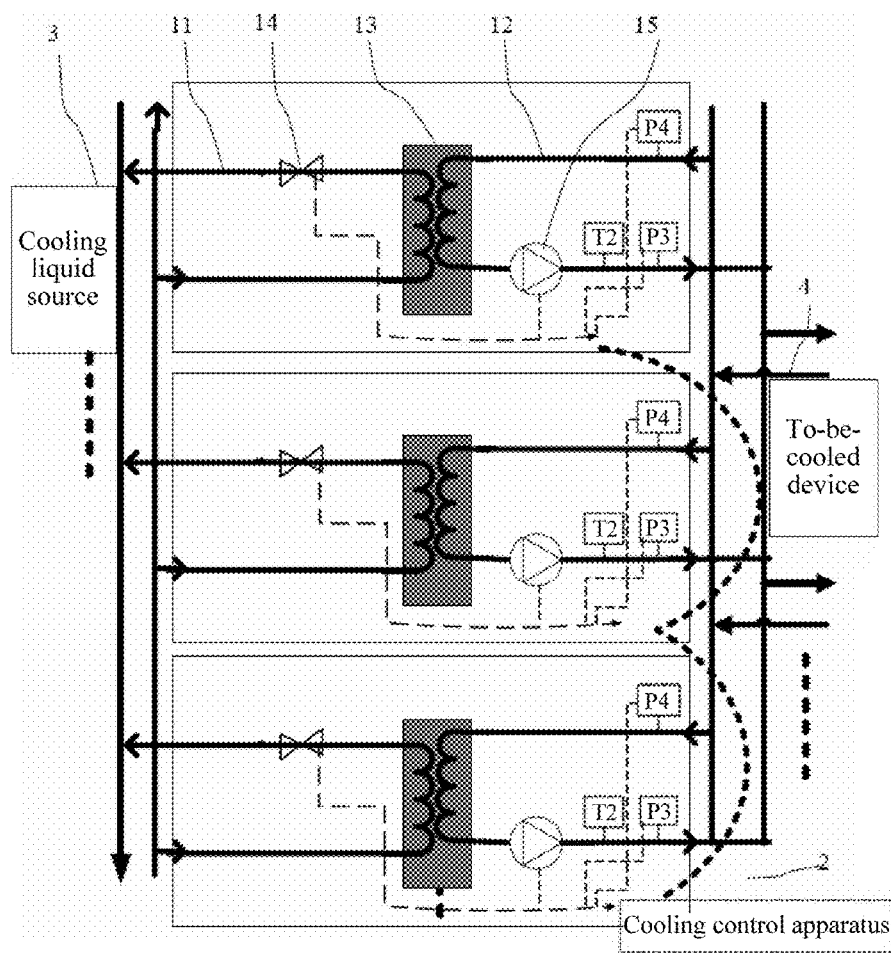
FIG. 1 is a schematic diagram of a liquid cooling system according to a first embodiment of the present disclosure.

Refer to FIG. 1, which shows a first embodiment of a liquid cooling system according to the present disclosure, including a cooling control apparatus 2 and at least two second-level liquid circulation loops 12 configured to dissipate heat of a to-be-cooled device.

The at least two second-level liquid circulation loops 12 are connected in parallel. A heat exchanger 13 is connected in each of the second-level liquid circulation loops 12, and a cooling apparatus is disposed on each heat exchanger 13. In this embodiment, the cooling apparatus is a first-level liquid circulation loop 11. In this embodiment, there are three second-level liquid circulation loops 12, and correspondingly, there are also three heat exchangers 13 and three first-level liquid circulation loops 11.

The first-level liquid circulation loops 11 are connected in parallel and in communication, and share a cooling liquid source 3. There may be one cooling liquid source 3, or two or more cooling liquid sources 3. The heat exchanger 13 is disposed between the first-level liquid circulation loop 11 and the second-level liquid circulation loop 12, and is configured to exchange heat between the first-level liquid circulation loop 11 and the second-level liquid circulation loop 12 and separate liquid circulating water in the two. Liquid in the first-level liquid circulation loop 11 may take heat away from liquid in the second-level liquid circulation loop 12 using the heat exchanger 13. The second-level liquid circulation loops 12 are connected in parallel and in communication. After liquid in the second-level liquid circulation loops 12 flows back, the liquid is supplied to a to-be-cooled device 4 and takes heat away from the to-be-cooled device 4. The second-level liquid circulation loops 12 may dissipate heat of one to-be-cooled device 4, or may dissipate heat of two or more to-be-cooled devices 4.

A valve 14 is provided on the first-level liquid circulation loop 11. By controlling an opening size of the valve 14, a liquid flow in the first-level liquid circulation loop 11 can be controlled, thereby controlling a temperature of the liquid flowing towards the to-be-cooled device 4 in the second-level liquid circulation loop 12. In this embodiment, a proportional valve is used as the valve 14, and an opening size regulation value of the proportional valve is a voltage value. A voltage of the proportional valve is adjusted, such that an opening of the proportional valve reaches a certain size, thereby controlling a flow in the first-level liquid circulation loop 11 and achieving an objective of adjusting a liquid temperature in the second-level liquid circulation loop 12. Herein, the valve 14 may also be a servo valve or the like, and its opening size can be controlled by controlling an electrical signal.

The second-level liquid circulation loop 12 is provided with a circulating pump 15 configured to control a liquid flow and a sensing apparatus configured to acquire liquid sample data. By controlling rotation of the circulating pump 15, a liquid flow in the second-level liquid circulation loop 12 is controlled. In this embodiment, the circulating pump 15 is a variable frequency pump, and by controlling a frequency of the variable frequency pump, a flow velocity of the liquid in the second-level circulation loop can be controlled, thereby achieving an objective of controlling a liquid flow. Herein, in other implementation manners, the circulating pump 15 may also be a water pump or a stepper motor-controlled water pump.

The liquid sample data includes a liquid temperature and at least one of a liquid flow and liquid pressure. In this embodiment, the sensing apparatus includes a temperature sensor T2 and pressure sensors P3 and P4, where the temperature sensor T2 is configured to acquire a liquid temperature and disposed at a position whose flow direction is towards the to-be-cooled device 4 on the second-level liquid circulation loop 12, and can acquire a temperature of liquid flowing into the to-be-cooled device 4 in the second-level liquid circulation loop 12. Herein, the temperature sensor T2 may also be disposed at a position whose flow direction is out of the to-be-cooled device 4 on the second-level liquid circulation loop 12, so as to acquire a temperature of liquid flowing out of the to-be-cooled device 4 in the second-level liquid circulation loop 12, as long as it is ensured that positions of temperature sensors on the second-level liquid circulation loops 12 are the same, that is, liquid temperatures at same positions of the second-level liquid circulation loops 12 are acquired. There are two pressure sensors, which are separately disposed at a position whose flow direction is towards the to-be-cooled device 4 and a position whose flow direction is out of the to-be-cooled device 4 on the second-level liquid circulation loop 12 and are configured to acquire a first pressure value of liquid flowing towards the to-be-cooled device 4 and a second pressure value of liquid flowing back from the to-be-cooled device 4.

Herein, because conversion can be performed between the liquid flow and the liquid pressure, the liquid pressure that needs to be collected may be replaced by the liquid flow, and the pressure sensor may be replaced by a flow meter. Similarly, the liquid flow includes a first flow of liquid flowing towards the to-be-cooled device 4 and a second flow of liquid flowing back from the to-be-cooled device 4 in the second-level liquid circulation loop 12. First liquid flows and second liquid flows of the second-level liquid circulation loops 12 are calculated separately.

The cooling control apparatus 2 is electrically connected to each of the sensing apparatuses, each of the circulating pumps 15, and each of the valves 14. The cooling control apparatus 2 is configured to implement sharing of the liquid sample data of the sensing apparatuses of the at least two second-level liquid circulation loops 12, perform analytical processing on the liquid sample data of the sensing apparatuses of the at least two second-level liquid circulation loops 12, and send a same control signal to the circulating pumps 15, so as to control all the circulating pumps 15 to be in a same running state, and send a same control signal to the valves 14, so as to control all the valves 14 to be in a same running state, such that running states of the circulating pumps 15 are the same and opening sizes of the valves 14 are the same.

Figure 2:
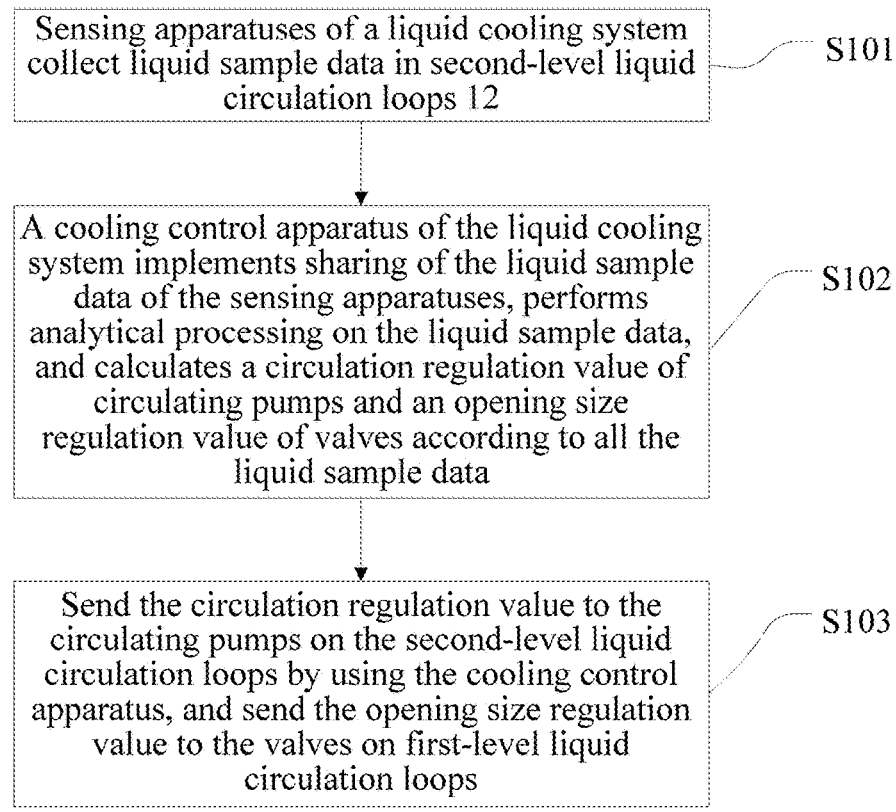
FIG. 2 is a flowchart of a control method of the liquid cooling system in FIG. 1 according to the present disclosure.

As shown in FIG. 2, a control method of the liquid cooling system in this embodiment includes the following steps.

S101: Collect liquid sample data in second-level liquid circulation loops 12 using sensing apparatuses of the liquid cooling system, where the liquid sample data includes a liquid temperature and at least one of a liquid flow and liquid pressure. Because conversion can be performed between the liquid flow and the liquid pressure according to data about pipes used for the second-level liquid circulation loops 12, only one of the two needs to be collected. In this embodiment, the liquid pressure is collected, and, in order to ensure accuracy, both the liquid flow and the liquid pressure may be collected. In this embodiment, the liquid temperature is a temperature of liquid flowing towards a to-be-cooled device 4 in the second-level liquid circulation loop 12. The liquid pressure includes first pressure of liquid flowing towards the to-be-cooled device 4 and second pressure of liquid flowing back from the to-be-cooled device 4 in the second-level liquid circulation loop 12.

S102: A cooling control apparatus 2 of the liquid cooling system implements sharing of the liquid sample data of the sensing apparatuses, performs analytical processing on the liquid sample data, and calculates, according to all the liquid sample data, a circulation regulation value corresponding to the circulating pumps 15 of the second-level liquid circulation loops and an opening size regulation value corresponding to the valves 14 of the first-level liquid circulation loops. The circulation regulation value is a signal value that can control working efficiency of the circulating pumps 15. For example, when the circulating pump 15 is a variable frequency pump, the circulation regulation value is a corresponding frequency value of the variable frequency pump. The opening size regulation value is a signal value that can control an opening size of the valve 14. For example, when the valve 14 is a proportional valve, the opening size regulation value is a corresponding voltage value of the proportional valve.

A method for calculating the circulation regulation value is as follows: calculating differences between first liquid pressure values and second pressure values of the second-level liquid circulation loops 12, to calculate liquid pressure differences of the second-level liquid circulation loops 12; calculating an average liquid pressure difference value of the liquid pressure differences of the second-level liquid circulation loops 12; and comparing the average liquid pressure value with a preset target pressure difference value of liquid pressure, to calculate the circulation regulation value of the circulating pumps 15. In this embodiment, a frequency value of the variable frequency pumps is calculated. The preset target pressure difference value is a liquid pressure difference when the liquid cooling system reaches an optimum running state. Herein, if only one liquid pressure value is collected on each of the second-level liquid circulation loops 12, collections points on the second-level liquid circulation loops 12 are the same; therefore, an average value of liquid pressure values of the second-level liquid circulation loops 12 is directly calculated, and then the average value is compared with the preset target value to calculate the circulation regulation value of the circulating pumps 15.

A method for calculating the opening size regulation value is as follows: calculating an average value of liquid temperatures of the second-level liquid circulation loops 12, and calculating the opening size regulation value according to the average temperature value and a preset target temperature value. In this embodiment, a voltage value of the proportional valves is calculated. The preset target temperature value is a liquid temperature when the liquid cooling system reaches an optimum running state.

Herein, methods for calculating the circulation regulation value and the opening size regulation value are not limited to the foregoing methods. For example, the foregoing liquid temperatures may also be used as factors affecting the circulation regulation value. That is, a calculation result of the circulation regulation value may also be related to the liquid temperatures, and by controlling liquid flows in the second-level liquid circulation loops, heat exchange speeds are controlled, thereby affecting the liquid temperatures.

S103: Send the circulation regulation value to the circulating pumps 15 on the second-level liquid circulation loops 12 using the cooling control apparatus, such that all the circulating pumps 15 on the second-level liquid circulation loops 12 run according to the circulation regulation value, and send the opening size regulation value to the valves 14 on the first-level liquid circulation loops 11, such that all the valves 14 on the first-level liquid circulation loops 11 run according to the opening size regulation value. By controlling the circulating pumps 15, liquid flows in the second-level liquid circulation loops 12 are controlled. By controlling the valves 14, liquid flows in the first-level liquid circulation loops 11 can be controlled, so as to control heat taken away from the second-level liquid circulation loops 12 by the first-level liquid circulation loops 11, thereby controlling liquid temperatures in the second-level liquid circulation loops 12 and achieving an objective of adjusting the liquid temperatures in the second-level liquid circulation loops 12.

Through the foregoing steps, by using a cooling control apparatus 2, sharing and centralized analytical processing of liquid sample data are implemented, and a same circulation regulation value or opening size regulation value is sent to circulating pumps 15 or valves 14, to implement synchronization control over the circulating pumps 15 and the valves 14, such that first-level liquid circulation loops 11 and second-level liquid circulation loops 12 run in a same running state. In this way, liquid flows and temperatures in the second-level liquid circulation loops 12 are the same, a risk of damaging the circulating pumps 15 and the valves 14 is reduced, and reliability is improved, which helps balance overall control over a system, avoids oscillations of adjustments of the circulating pumps 15 and the valves 14 caused by independent control, prolongs service lives of the circulating pumps 15 and the valves 14, improves performance and a service life of an entire heat dissipation device, and ensures that heat of a to-be-cooled device 4 is dissipated effectively and stably.

Figure 3:
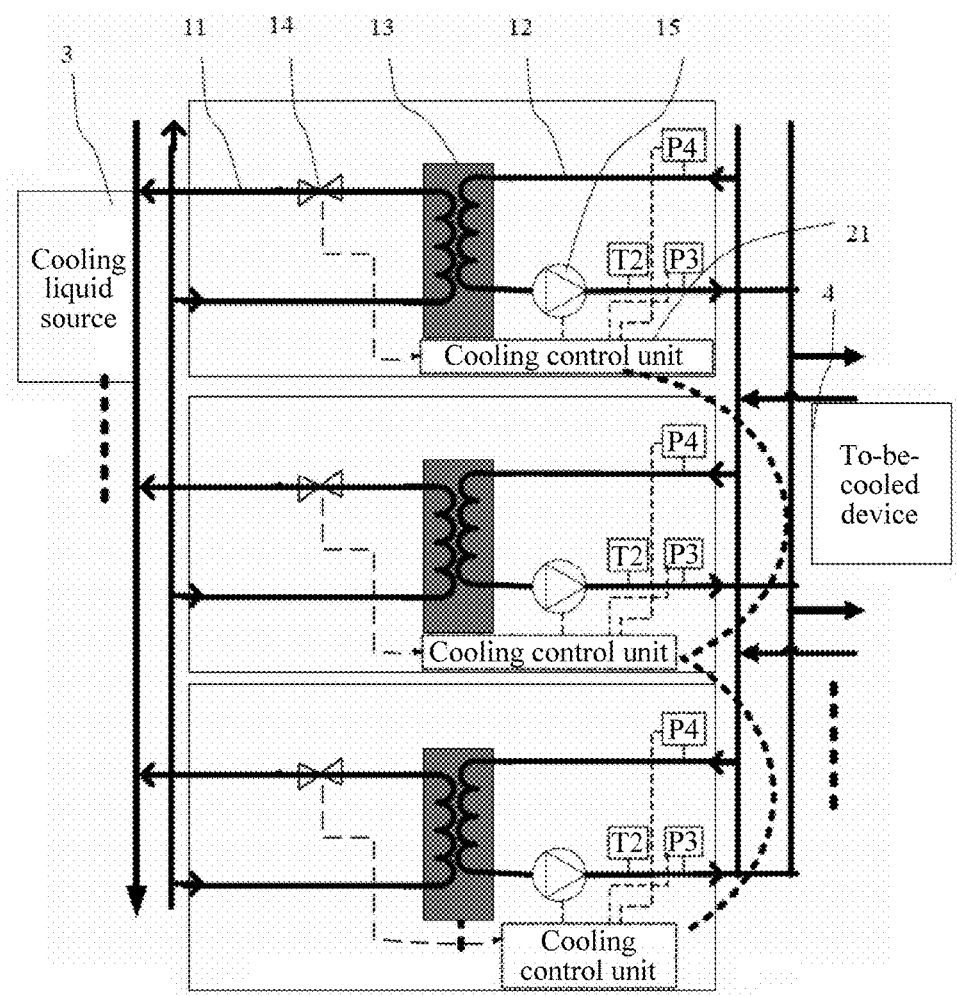
FIG. 3 is a schematic diagram of a liquid cooling system according to a second embodiment of the present disclosure.

As shown in FIG. 3, a second embodiment of a liquid cooling system according to the present disclosure includes a cooling control apparatus 2 and at least two second-level liquid circulation loops 12 configured to dissipate heat of a to-be-cooled device. The at least two liquid circulation loops 12 are connected in parallel. A heat exchanger 13 is connected in each of the second-level liquid circulation loops 12, and a cooling apparatus is disposed on each heat exchanger 13, where the cooling apparatus is a first-level liquid circulation loop 11. In this embodiment, components except the cooling control apparatus 2 are the same as those in the first embodiment, and are not described in detail herein. This embodiment describes only the cooling control apparatus 2 in detail.

The cooling control apparatus 2 includes at least two cooling control units 21. The cooling control units 21 are electrically connected and share data. The cooling control units 21 are in a one-to-one correspondence and cooperation with the second-level liquid circulation loops 12. The cooling control unit 21 includes a data collection module, a data filtering module, a signal control module, and a communication module. The data collection module is configured to receive liquid sample data acquired by the sensing apparatus, the data filtering module is configured to filter the liquid sample data, the signal control module is configured to perform analytical processing on the liquid sample data and send control signals to the valves 14 and the circulating pumps 15, and the communication module is configured to control data transmission between the cooling control units 21. The liquid sample data received by the data collection module is filtered by the data filtering module and then sent to the signal control module, the signal control module performs analytical processing on the liquid sample data, data sharing between the cooling control units 21 is implemented using the communication module, and the signal control module sends the control signals to the valves 14 and the circulating pumps 15 to control running states of the valves 14 and the circulating pumps 15.

In this embodiment, the signal control module performs average value processing on the liquid sample data of the second-level liquid circulation loops 12, and compares an average value with a preset target value, to calculate a frequency value of the variable frequency pumps. The preset target value may be liquid data when the liquid cooling system reaches an optimum running state.

The cooling control units 21 may be connected by a communications bus or may be connected by means of wireless transmission. The pressure sensors P3 and P4 and the temperature sensor T2 of the sensing apparatus may all be connected to the cooling control units 21 by a communications bus or wirelessly.

Further, the liquid cooling system further includes at least one second-level liquid circulation loop 12 used for backup, such that there are at least three second-level liquid circulation loops 12 in this embodiment. The cooling control unit 21 further includes a self-diagnosis module configured to identify a fault of a corresponding second-level liquid circulation loop 12. The self-diagnosis module is used to determine whether collected liquid sample data exceeds an allowed error range, and start a preset fault processing mechanism.

Figure 4:
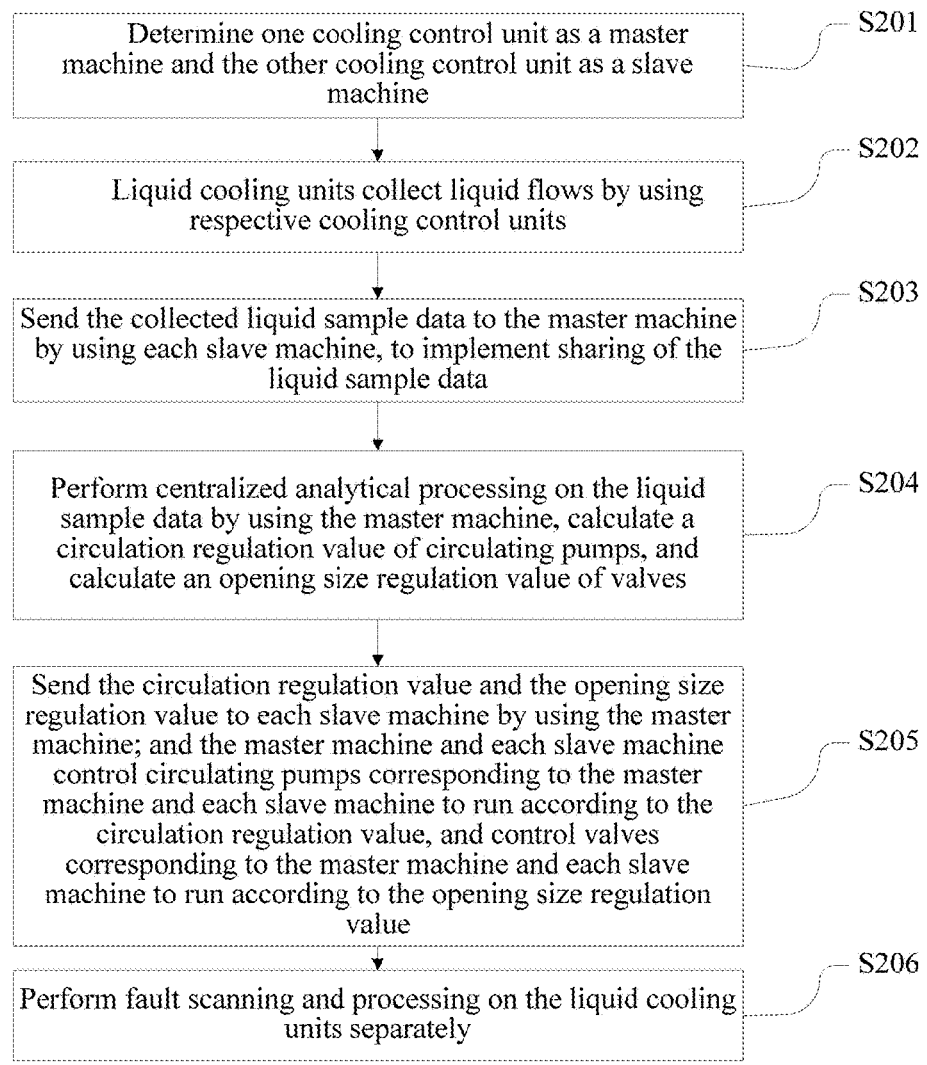
FIG. 4 is a flowchart of a control method of the liquid cooling system in FIG. 3 according to the present disclosure.

Correspondingly, as shown in FIG. 4, the present disclosure provides a control method of the liquid cooling system in the second embodiment. The method includes the following steps.

S201: Determine one cooling control unit as a master machine and the other cooling control unit as a slave machine.

Figure 5:
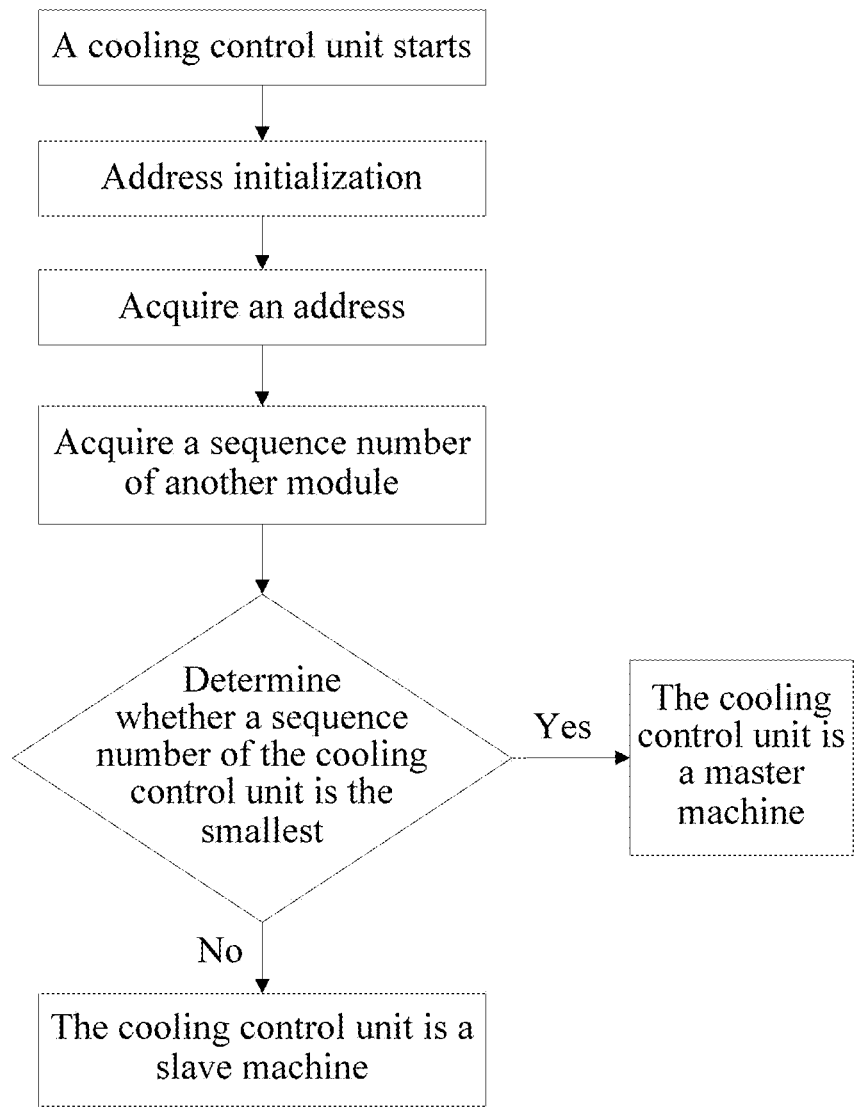
FIG. 5 is a flowchart of a method for determining master and slave machines according to the present disclosure.

In this embodiment, as shown in FIG. 5, after the cooling control units 21 are started, each of the cooling control units 21 performs address initialization, obtains an address, then acquires a sequence number of the other cooling control unit 21, and determines whether the sequence number is smaller or greater, where a cooling control unit 21 having a smallest sequence number is a master machine, and the other cooling control unit is a slave machine. In this way, the master and slave machines can be determined quickly. Herein, in another implementation manner, a cooling control unit 21 having a largest sequence number may be used as a master machine, and the other cooling control unit may be used as a slave machine; or the master and slave machines are determined using another method.

S202: The second-level liquid circulation loops collect liquid sample data using respective cooling control units 21.

S203: Send the collected liquid sample data to the master machine using each slave machine, to implement sharing of the liquid sample data between each slave machine and the master machine, where the liquid sample data includes a liquid temperature and at least one of a liquid flow and liquid pressure. In this embodiment, the liquid sample data includes liquid pressure and a liquid temperature. The liquid temperature is a temperature of liquid flowing towards the to-be-cooled device 4 in the second-level liquid circulation loop 12. The liquid pressure includes first pressure of liquid flowing towards the to-be-cooled device 4 and second pressure of liquid flowing back from the to-be-cooled device 4 in the second-level liquid circulation loop 12.

S204: Perform centralized analytical processing on the liquid sample data using the master machine, calculate, according to the liquid sample data, a circulation regulation value corresponding to circulating pumps 15 of the second-level liquid circulation loops, and calculate, according to the liquid sample data, an opening size regulation value corresponding to valves 14 in first-level liquid circulation loops.

A method for calculating the circulation regulation value is as follows: the master machine acquires first liquid pressure values and second pressure values collected by the master machine and each slave machine; the master machine calculates liquid pressure differences of the second-level liquid circulation loops 12; the master machine calculates an average liquid pressure value of the liquid pressure differences of the second-level liquid circulation loops 12, and compares the average liquid pressure value with a preset target value of liquid pressure, to calculate the circulation regulation value of the circulating pumps 15.

A method for calculating the opening size regulation value is as follows: the master machine acquires liquid temperatures collected by the master machine and the slave machine, calculates an average value of the liquid temperatures, and calculates the opening size regulation value according to the average temperature value and a preset target temperature value.

S205: Send the circulation regulation value and the opening size regulation value to each slave machine using the master machine, control, using the master machine and each slave machine, circulating pumps 15 corresponding to the master machine and each slave machine to run according to the circulation regulation value, and control valves 14 corresponding to the master machine and each slave machine to run according to the opening size regulation value.

S206: Perform fault scanning and processing on the second-level liquid circulation loops 12 separately. The step includes the following steps.

It is determined whether the collected liquid sample data exceeds an allowed error range. A failure proportional coefficient may be set, a difference between a liquid sample value and a preset value is calculated; if the difference is greater than the preset value multiplied by the failure proportional coefficient, it indicates that the allowed error range is exceeded and a fault occurs in the second-level liquid circulation loop 12; otherwise, the second-level liquid circulation loop 12 is normal.

If the collected liquid sample data exceeds the allowed error range, it is determined that a fault occurs in a second-level liquid circulation loop corresponding to the liquid sample data exceeding the allowed error range; therefore, a preset fault processing mechanism is started. That is, at least one backup second-level liquid circulation loop is provided, and switching from the faulty second-level liquid circulation loop to the backup second-level liquid circulation loop is performed.

The backup second-level liquid circulation loop is checked, to check whether the backup second-level liquid circulation loop is normal; and if the backup second-level liquid circulation loop is normal, switching from the faulty second-level liquid circulation loop 12 to the backup second-level liquid circulation loop 12 is performed; otherwise, a next backup second-level liquid circulation loop 12 is found and checked. In other implementation manners, switching may also be performed first, and after the backup second-level liquid circulation loop 12 runs, whether the backup second-level liquid circulation loop 12 can run normally is checked.

In a case in which there is one backup second-level liquid circulation loop, if the backup second-level liquid circulation loop is abnormal, fault alarming is performed; in a case in which there are two or more backup second-level liquid circulation loops, if one checked backup second-level liquid circulation loop is abnormal, switching to a next backup second-level liquid circulation loop is performed. During the switching to the next backup second-level liquid circulation loop, a preliminary check may also be performed, to check whether the backup second-level liquid circulation loop is normal.

The fault scanning and processing in this step may be implemented by setting a self-diagnosis module in the cooling control unit 21.

In this embodiment, there are three or more second-level liquid circulation loops 12, and the control method of the liquid cooling system further includes the following steps: dividing a running time of the liquid cooling system into multiple preset time segments, where a previous preset time segment and a next preset time segment are two successive time segments among the multiple preset time segments; within the previous preset time segment, selecting a preset quantity of second-level liquid circulation loops as standbys and stopping running the second-level liquid circulation loops, and starting running the other second-level liquid circulation loops to dissipate heat of a to-be-cooled device, where the preset quantity is at least one; and within the next preset time segment, starting running the second-level liquid circulation loops used as standbys within the previous preset time segment, to dissipate heat of the to-be-cooled device, and selecting, from the second-level liquid circulation loops running within the previous preset time segment, the preset quantity of second-level liquid circulation loops as standbys and stopping running the second-level liquid circulation loops.

By using the foregoing method, in an entire running process of a system, there are always a preset quantity of second-level liquid circulation loops that are in a standby state and stop running and multiple second-level liquid circulation loops that are cyclically in a running state, so as to avoid that one second-level liquid circulation loop remains in a running state for a long time and reliability is affected, thereby further ensuring reliability of running of the entire liquid cooling system. In addition, when a fault occurs in a second-level liquid circulation loop in a running state, a standby second-level liquid circulation loop can be started, so as to ensure normal running of the entire liquid cooling system. Herein, the method may also be applied to the first embodiment or other embodiments.

Figure 6:
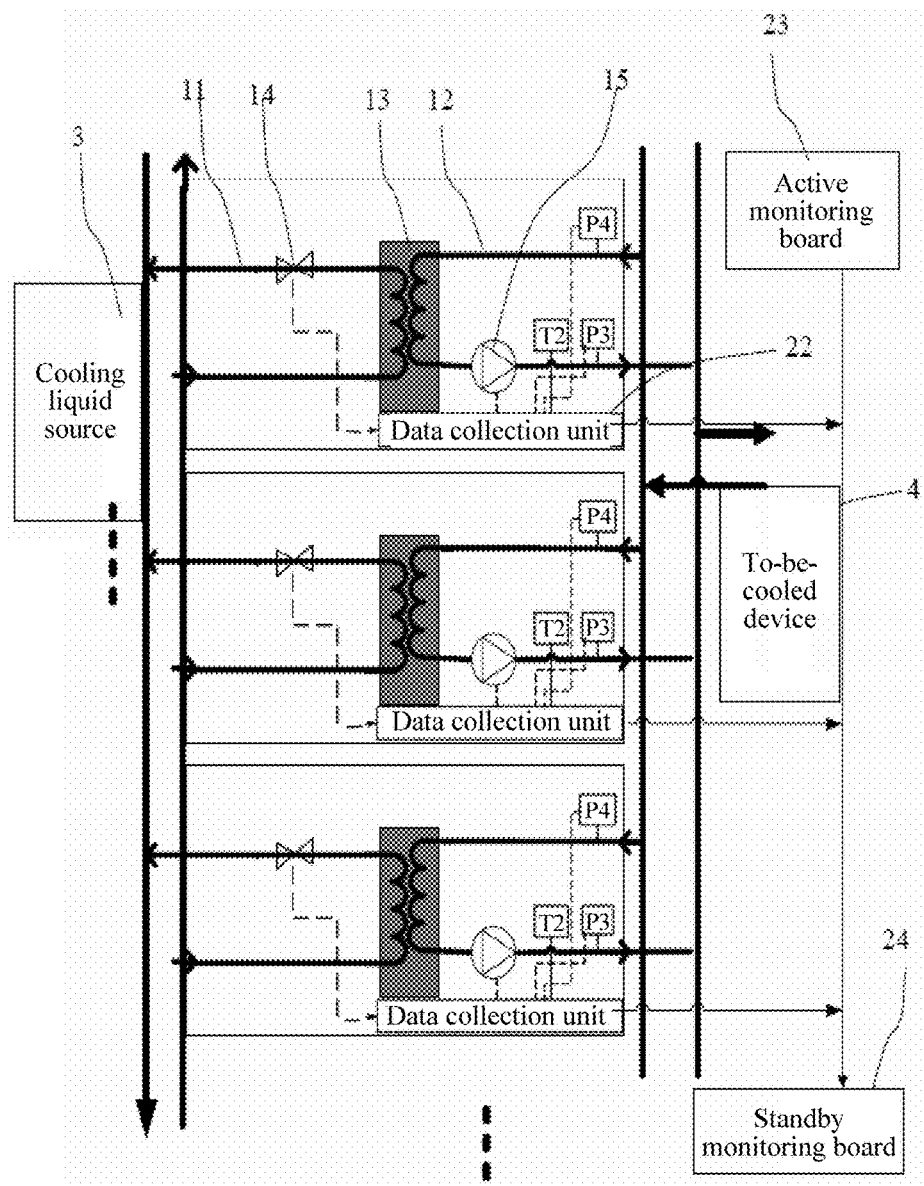
FIG. 6 is a schematic diagram of a liquid cooling system according to a third embodiment of the present disclosure.

As shown in FIG. 6, a third embodiment of a liquid cooling system according to the present disclosure includes at least two second-level liquid circulation loops 12 and a cooling control apparatus 2. In this embodiment, components except the cooling control apparatus 2 are the same as those in the first embodiment, and are not described in detail herein. This embodiment describes only the cooling control apparatus 2 in detail.

The cooling control apparatus 2 includes at least two data collection units 22 and a monitoring board, where the data collection units 22 are in a one-to-one correspondence with the second-level liquid circulation loops 12, and the data collection units 22 are electrically connected to corresponding sensing apparatuses of the second-level liquid circulation loops 12 and are configured to collect liquid sample data. All the data collection units 22 are electrically connected to the monitoring board, so as to send the liquid sample data to the monitoring board, thereby implementing data sharing between the data collection units 22. The monitoring board is configured to perform analytical processing on the liquid sample data; and the monitoring board is electrically connected to circulating pumps 15 and valves 14, so as to send control signals to the circulating pumps 15 and the valves 14.

There are two monitoring boards, which are an active monitoring board 23 and a standby monitoring board 24.

Normally, control over the entire liquid cooling system is implemented using the active monitoring board 23, and when a fault occurs in the active monitoring board 23, the standby monitoring board 24 may be started to implement control over the entire liquid cooling system, so as to avoid that the fault in the active monitoring board 23 affects running of the entire liquid cooling system.

Figure 7:
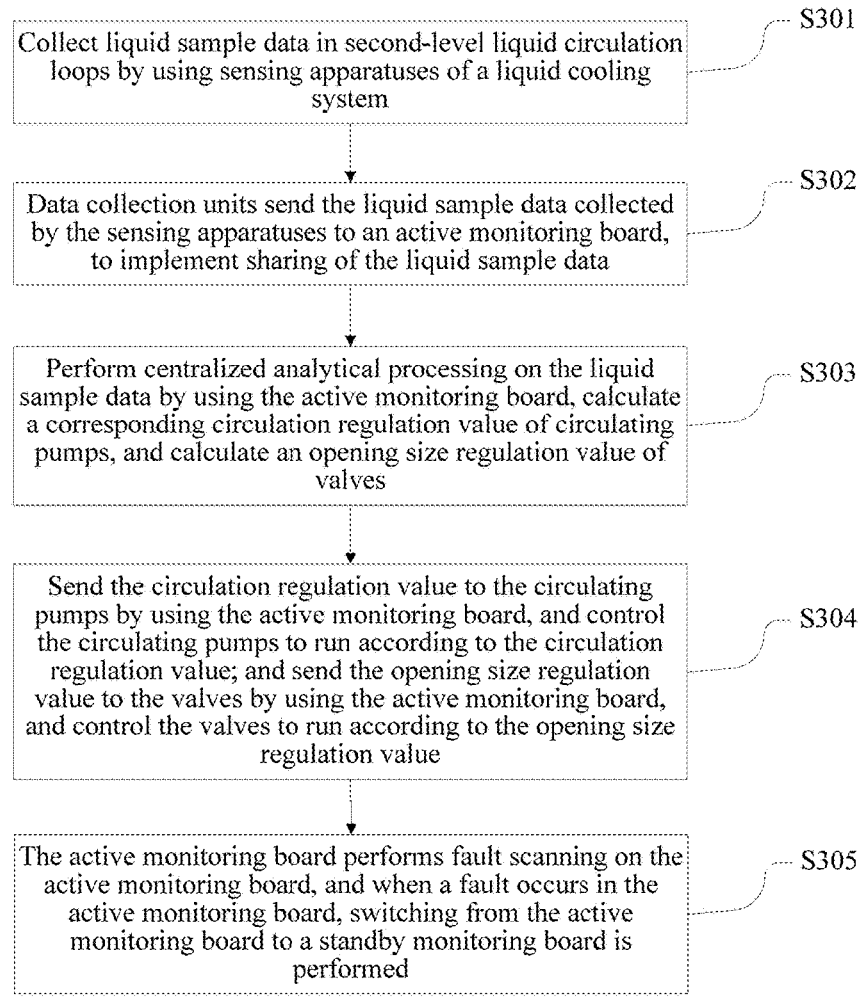
FIG. 7 is a flowchart of a control method of the liquid cooling system in FIG. 6 according to the present disclosure.

Correspondingly, as shown in FIG. 7, the present disclosure provides a control method of the liquid cooling system in the third embodiment. The control method includes the following steps.

S301: Collect liquid sample data in the second-level liquid circulation loops 12 using the sensing apparatuses of the liquid cooling system.

S302: Send the liquid sample data acquired by the sensing apparatuses to the active monitoring board 23 using the data collection units 22, to implement sharing of the liquid sample data.

S303: Perform centralized analytical processing on the liquid sample data using the active monitoring board 23, calculate a circulation regulation value corresponding to the circulating pumps of the second-level liquid circulation loops, and calculate an opening size regulation value corresponding to the valves 14 on the first-level liquid circulation loops. Calculation methods are the same as those in the foregoing embodiment, and are not described in detail herein.

S304: Send the circulation regulation value to the circulating pumps 15 on the second-level liquid circulation loops 12 using the active monitoring board 23, and control the circulating pumps 15 to run according to the circulation regulation value; and send the opening size regulation value to the valves 14 on the first-level liquid circulation loops 11 using the active monitoring board 23, and control the valves 14 to run according to the opening size regulation value, such that the circulating pumps 15 are in a same running state and the valves 14 are in a same running state.

S305: The active monitoring board 23 performs fault scanning on the active monitoring board 23, and when a fault occurs in the active monitoring board 23, switching from the active monitoring board 23 to the standby monitoring board 24 is performed.

In this embodiment, each of the second-level liquid circulation loops 12 is provided with only the data collection unit 22, which can reduce costs, simplify a structure of the entire second-level liquid circulation loop 12, and facilitate control. Two monitoring boards are used, which can avoid that failure of a monitoring board affects the entire liquid cooling system and ensure that heat of the to-be-cooled device 4 is dissipated effectively and stably.

In the foregoing three embodiments, if no valve 14 is provided in the first-level circulation loop, there is no need to set the temperature sensor to collect the liquid temperature, and there is no need to control the valve 14.

Figure 8:
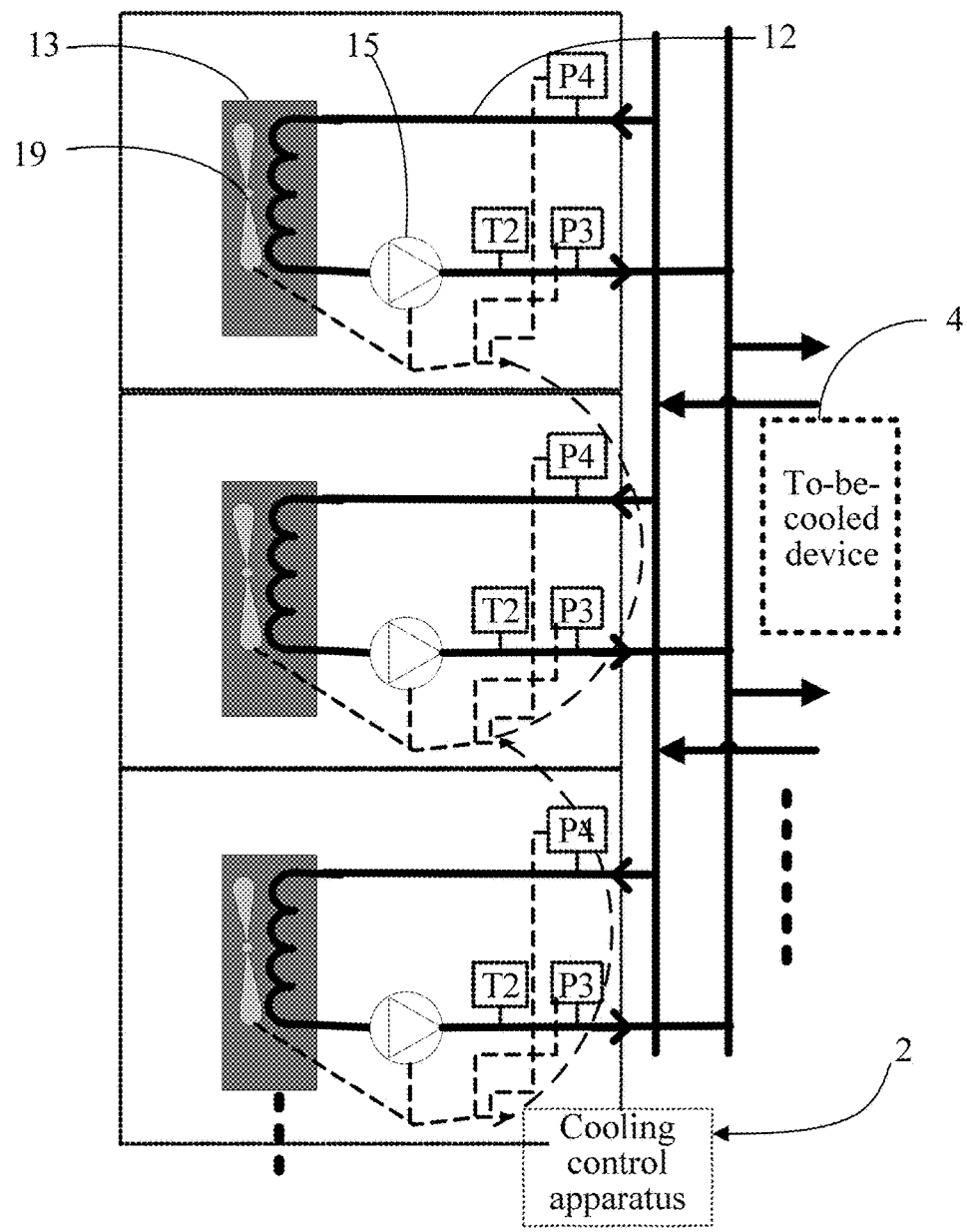
FIG. 8 is a schematic diagram of a liquid cooling system according to a fourth embodiment of the present disclosure.

As shown in FIG. 8, a fourth embodiment of a liquid cooling system according to the present disclosure includes at least two second-level liquid circulation loops 12 configured to dissipate heat of a to-be-cooled device and a cooling control apparatus 2.

A heat exchanger 13 is connected in each of the second-level liquid circulation loops 12, and a cooling apparatus is disposed on each heat exchanger 13, where the cooling apparatus is a fan 19, so as to dissipate heat of the second-level liquid circulation loops 12.

Other structures of the second-level liquid circulation loop 12 and a structure of the cooling control apparatus 2 are the same as those in the first embodiment, and are not described in detail herein.

The control method of the liquid cooling system in the fourth embodiment includes the following steps.

S401: Collect liquid sample data in second-level liquid circulation loops 12 using sensing apparatuses of the liquid cooling system, where the liquid sample data includes a liquid temperature and at least one of a liquid flow and liquid pressure.

S402: Implement sharing of the liquid sample data of the sensing apparatuses using the cooling control apparatus 2 of the liquid cooling system, perform analytical processing on the liquid sample data, and calculate, according to all the liquid sample data, a circulation regulation value corresponding to circulating pumps 15 of the second-level liquid circulation loops and a rotation speed regulation value corresponding to the fans 19. The circulation regulation value is a signal value that can control working efficiency of the circulating pumps 15. For example, when the circulating pump 15 is a variable frequency pump, the circulation regulation value is a corresponding frequency value of the variable frequency pump. The rotation speed regulation value is a single value that can control a rotation speed of the fans 19.

A method for calculating the rotation speed regulation value is the same as the method for calculating the opening size regulation value of the valves in the first embodiment: calculating an average value of liquid temperatures of the second-level liquid circulation loops 12, and calculating the rotation speed regulation value according to the average temperature value and a preset target temperature value.

S403: Send the circulation regulation value to the circulating pumps 15 on the second-level liquid circulation loops 12 using the cooling control apparatus, such that all the circulating pumps 15 run according to the circulation regulation value; and send the rotation speed regulation value to the fans 19, such that all the fans 19 run according to the rotation speed regulation value. By controlling the circulating pumps 15, liquid flows in the second-level liquid circulation loops 12 are controlled. By controlling the fans 19, heat taken away from the second-level liquid circulation loops 12 by the first-level liquid circulation loops 11 is controlled, thereby controlling liquid temperatures in the second-level liquid circulation loops 12 and achieving an objective of adjusting the liquid temperatures of the second-level liquid circulation loops 12. In addition, rotation speeds of the fans 19 are the same, which can avoid oscillations of the fans 19 and help reduce noise of the fans and increase service lives of the fans.

Through the foregoing steps, using a cooling control apparatus 2, sharing and centralized analytical processing of liquid sample data are implemented, and a same circulation regulation value or opening size regulation value is sent to circulating pumps 15 or fans 19, to implement synchronization control over the circulating pumps 15 and the fans 19, such that the fans 19 and second-level liquid circulation loops 12 run in a same running state. In this way, liquid flows and temperatures in the second-level liquid circulation loops 12 are the same, a risk of damaging the circulating pumps 15 and the fans 19 is reduced, and reliability is improved, which helps balance overall control over a system, avoids oscillations of adjustments of the circulating pumps 15 and the fans 19 caused by independent control, prolongs service lives of the circulating pumps 15 and the fans 19, improves performance and a service life of an entire heat dissipation device, and ensures that heat of a to-be-cooled device 4 is dissipated effectively and stably.

Herein, control over the liquid cooling system may also be implemented using the cooling control apparatuses 2 and the control methods in the second embodiment and the third embodiment, where a method for controlling the fan 19 is the same as the method for controlling the valve 14, and is not described in detail herein.

In the foregoing embodiment, both the first-level liquid circulation loop and the fan 19 are different embodiments of the cooling apparatus in the liquid cooling system. In other embodiments, the cooling apparatus may also be a semiconductor cooling apparatus, a vapor compression cooling apparatus, or the like. Control over the cooling apparatus may be implemented using any embodiment of the first to third embodiments, and a corresponding cooling regulation value of the cooling apparatus is calculated using the cooling control apparatus, and the cooling regulation value is sent to the cooling apparatuses using the cooling control apparatus, such that the cooling apparatuses run according to the cooling regulation value. When the cooling apparatus is a semiconductor cooling apparatus, the cooling regulation value may be a current value of the semiconductor cooling apparatus, such that the cooling apparatuses reach a same working state, that is, reach a same cooling frequency, according to an instruction of the cooling control apparatus, thereby implementing synchronization control over the cooling apparatuses, avoiding oscillations of the cooling apparatuses caused by independent regulation of the cooling apparatuses, and prolonging service lives of the cooling apparatuses.

The foregoing implementation manners are not intended to limit the protection scope of the technical solutions. Any modification, equivalent replacement, and improvement made without departing from the spirit and principle of the foregoing implementation manners shall fall within the protection scope of the technical solutions.

What is claimed is:

1. A control method of a liquid cooling system the control method comprising:
    collecting, by sensing apparatuses of second-level liquid circulation loops of the liquid cooling system, liquid sample data from the second-level liquid circulation loops;
    implementing, by a cooling control apparatus of the liquid cooling system, sharing of the liquid sample data of the sensing apparatuses;
    performing analytical processing on the liquid sample data;
    calculating, according to the liquid sample data from each of the second-level liquid circulation loops, a circulation regulation value corresponding to circulating pumps of the second-level liquid circulation loops by:
        calculating an average liquid pressure difference value of the second-level liquid circulation loops; and
        comparing the average liquid pressure difference value to a preset target pressure difference value of liquid pressure to calculate the circulation regulation value corresponding to the circulating pumps of the second-level liquid circulation loops; and
    sending, by the cooling control apparatus, the circulation regulation value to each of the circulating pumps of the second-level liquid circulation loops, such that all the circulating pumps of the second-level liquid circulation loops run according to the circulation regulation value, the cooling control apparatus being electrically connected to each of the sensing apparatuses and each of the circulating pumps, and at least two second-level liquid circulation loops being connected in parallel.

2. The control method according to claim 1, further comprising performing fault scanning and processing on the second-level liquid circulation loops separately, performing fault scanning and processing on the second-level liquid circulation loops separately comprising:
    determining whether the collected liquid sample data exceeds an allowed error range;
    determining, when the collected liquid sample data exceeds the allowed error range, that a fault occurs in a second-level liquid circulation loop corresponding to the liquid sample data exceeding the allowed error range;
    providing at least one backup second-level liquid circulation loop; and
    switching from the faulty second-level liquid circulation loop to the backup second-level liquid circulation loop.

3. The control method according to claim 2, wherein performing fault scanning and processing on the second-level liquid circulation loops separately further comprises:
    checking whether the backup second-level liquid circulation loop is normal;
    performing fault alarming when the second-level liquid circulation loops comprise only one backup second-level liquid circulation loop and the backup second-level liquid circulation loop is abnormal; and
    switching to a next backup second-level liquid circulation loop when the second-level liquid circulation loops comprise two or more backup second-level liquid circulation loops and at least one checked backup second-level liquid circulation loop of the two or more backup second-level liquid circulation loops is abnormal.

4. The control method according to claim 1, wherein there are three or more second-level liquid circulation loops, and the control method further comprising:
    dividing a running time of the liquid cooling system into multiple preset time segments, a previous preset time segment and a next preset time segment being two successive time segments among the multiple preset time segments;
    selecting, within the previous preset time segment, a preset quantity of second-level liquid circulation loops as standbys and stopping running the second-level liquid circulation loops selected as standbys, and starting running at least one other second-level liquid circulation loop to dissipate heat of a to-be-cooled device, the preset quantity of second-level liquid circulation loops being at least one;
    starting running, within the next preset time segment, the second-level liquid circulation loops used as standbys within the previous preset time segment, to dissipate heat of the to-be-cooled device; and
    selecting, from the second-level liquid circulation loops running within the previous preset time segment, the preset quantity of second-level liquid circulation loops as standbys and stopping running the second-level liquid circulation loops selected as standbys.

5. The control method according to claim 1, wherein a heat exchanger is connected in each of the second-level liquid circulation loops, a cooling apparatus is disposed on each heat exchanger, the liquid sample data further comprising a liquid temperature, and the control method further comprising:

calculating, by the cooling control apparatuses, a cooling regulation value corresponding to the cooling apparatuses; and sending the cooling regulation value to the cooling apparatuses, such that all the cooling apparatuses run according to the cooling regulation value.

6. The control method according to claim 1, further comprising:

calculating, according to the liquid sample data from each of the second-level liquid circulation loops, an opening size regulation value corresponding to valves of first-level liquid circulation loops of the liquid cooling system, the opening size regulation value being a signal value that controls an opening size of a valve of the first-level liquid circulation loops; and sending, by the cooling control apparatus, the opening size regulation value to the valves of the first-level liquid circulation loops, such that all the valves of the first-level liquid circulation loops run according to the opening size regulation value.

7. The control method according to claim 6, wherein calculating the opening size regulation value comprises:

calculating an average value of liquid temperatures of the second-level liquid circulation loops; and calculating the opening size regulation value according to the average value of liquid temperatures and a preset target temperature value.

* * * * *

UNITED STATES PATENT AND TRADEMARK OFFICE
CERTIFICATE OF CORRECTION

PATENT NO. : 10,375,854 B2
APPLICATION NO. : 14/981068
DATED : August 6, 2019
INVENTOR(S) : Yunju Liu, Quanming Lv and Tanfu Xiao Page 1 of 1

It is certified that error appears in the above-identified patent and that said Letters Patent is hereby corrected as shown below:

On the Title Page

Page 2, Column 2, Line 9 2nd NPL should say "European Office Action" instead of "European Office ction"

Signed and Sealed this
Seventeenth Day of September, 2019

Andrei Iancu
*Director of the United States Patent and Trademark Office*